(12) United States Patent
Akutsu et al.

(10) Patent No.: US 9,136,358 B2
(45) Date of Patent: Sep. 15, 2015

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Yoshihiro Akutsu, Mei-ken (JP); Hiroshi Shinohara, Kanagawa-ken (JP); Ryota Katsumata, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/019,788

(22) Filed: Sep. 6, 2013

(65) Prior Publication Data

US 2014/0284692 A1 Sep. 25, 2014

Related U.S. Application Data

(60) Provisional application No. 61/803,531, filed on Mar. 20, 2013.

(51) Int. Cl.
*H01L 29/792* (2006.01)
*H01L 29/66* (2006.01)
*H01L 27/115* (2006.01)

(52) U.S. Cl.
CPC ...... *H01L 29/66833* (2013.01); *H01L 27/1157* (2013.01); *H01L 27/11582* (2013.01); *H01L 29/7926* (2013.01)

(58) Field of Classification Search
CPC ............... H01L 27/11578; H01L 27/11582; H01L 21/8221; H01L 29/792; H01L 29/7926; H01L 29/66833

USPC .......................................... 257/324; 438/287
See application file for complete search history.

(56) References Cited

U.S. PATENT DOCUMENTS

| 8,198,661 | B2 | 6/2012 | Fujimoto |
| 8,278,172 | B2 | 10/2012 | Fujimoto et al. |
| 8,350,323 | B2 | 1/2013 | Mikasa |
| 8,492,814 | B2 | 7/2013 | Fujimoto et al. |
| 2010/0148233 | A1 | 6/2010 | Fujimoto |

(Continued)

FOREIGN PATENT DOCUMENTS

| JP | 2010-123721 | 6/2010 |
| JP | 2010-141259 | 6/2010 |

(Continued)

*Primary Examiner* — Tu-Tu Ho
(74) *Attorney, Agent, or Firm* — Oblon, McClelland, Maier & Neustadt, L.L.P.

(57) ABSTRACT

According to one embodiment, a nonvolatile semiconductor memory device includes: a stacked body including a plurality of electrode layers and a plurality of first insulating layers; a first channel body layer penetrating the stacked body; a memory film; an interlayer insulating film provided on the stacked body; a selection gate electrode provided on the interlayer insulating film; a second channel body layer penetrating the selection gate electrode and the interlayer insulating film and connected to the first channel body; a gate insulating film provided between the selection gate electrode and the second channel body layer; a second insulating layer provided on the gate insulating film and on the selection gate electrode; a contact layer provided on the second insulating layer; and a diffusion layer provided between the contact layer and the second insulating layer and connected to the second channel body layer and the contact layer.

7 Claims, 14 Drawing Sheets

(56) References Cited

U.S. PATENT DOCUMENTS

| | | |
|---|---|---|
| 2011/0033994 A1 | 2/2011 | Fujimoto et al. |
| 2011/0233662 A1 | 9/2011 | Mikasa |
| 2012/0313156 A1 | 12/2012 | Fujimoto et al. |
| 2013/0056816 A1* | 3/2013 | Iwase et al. .................. 257/316 |

FOREIGN PATENT DOCUMENTS

| | | |
|---|---|---|
| JP | 2011-40421 | 2/2011 |
| JP | 2011-205030 | 10/2011 |
| JP | 2012-4230 | 1/2012 |
| JP | 2012-4510 | 1/2012 |

* cited by examiner

US 9,136,358 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/803,531, filed on Mar. 20, 2013; the entire contents of which are incorporated herein by reference.

FIELD

Embodiments described herein relate generally to a nonvolatile semiconductor memory and a method for manufacturing same.

BACKGROUND

As a method of increasing the capacity of and reducing the cost of a semiconductor memory device, there is a batch processing type stacked memory. The batch processing type stacked memory is manufactured as follows: a stacked body is formed by alternately stacking an insulating film and an electrode film on a semiconductor substrate, thereafter a through hole is formed in the stacked body by lithography, a block layer, a charge storage layer and a tunnel layer are deposited within the through hole in this order and a silicon pillar is embedded into the through hole.

In the stacked memory as described above, a memory transistor is formed at the intersection portion of the electrode film and the silicon pillar, and this serves as a memory cell. A selection gate electrode is provided on the stacked body, the silicon pillar is made to penetrate the selection gate electrode, the upper end of the silicon pillar is connected to a wiring in an upper layer and thus a selection transistor is formed between the selection gate electrode and the silicon pillar. Then, the selection transistor is controlled, and thus it is possible to switch whether or not the silicon pillar is connected to the wiring in the upper layer.

BRIEF DESCRIPTION OF THE DRAWINGS

FIG. 3A is a schematic cross-sectional view on an X-Z plane of FIG. 1, and FIG. 3B is a schematic cross-sectional view on a Y-Z plane of FIG. 1;

FIG. 4A is a schematic cross-sectional view on the X-Z plane of FIG. 1, and FIG. 4B is a schematic cross-sectional view on the Y-Z plane of FIG. 1;

FIG. 13A is a schematic cross-sectional view in the X-Z plane on FIG. 1, and FIG. 13B is a schematic cross-sectional view on the Y-Z plane of FIG. 1;

DETAILED DESCRIPTION

In general, according to one embodiment, a nonvolatile semiconductor memory device includes: a foundation layer; a stacked body provided on the foundation layer, and the stacked body including a plurality of electrode layers and a plurality of first insulating layers alternately stacked; a first channel body layer penetrating the stacked body in a stacking direction of the stacked body; a memory film provided between each of the plurality of electrode layers and the first channel body layer; an interlayer insulating film provided on the stacked body; a selection gate electrode provided on the interlayer insulating film; a second channel body layer penetrating the selection gate electrode and the interlayer insulating film in the stacking direction, and a second channel body layer being connected to the first channel body; a gate insulating film provided between the selection gate electrode and the second channel body layer; a second insulating layer provided on the gate insulating film and on the selection gate electrode; a contact layer provided on the second insulating layer; and a diffusion layer provided between the contact layer and the second insulating layer, and the diffusion layer being connected to the second channel body layer and the contact layer.

Embodiments will now be described below with reference to the drawings. In the following description, like members are identified with like numerals, and the description of members described once will be omitted as appropriate.

(First Embodiment)

In order to grasp the outline of a nonvolatile semiconductor memory device according to a first embodiment, the outline of a memory cell will be described.

Figure 1:
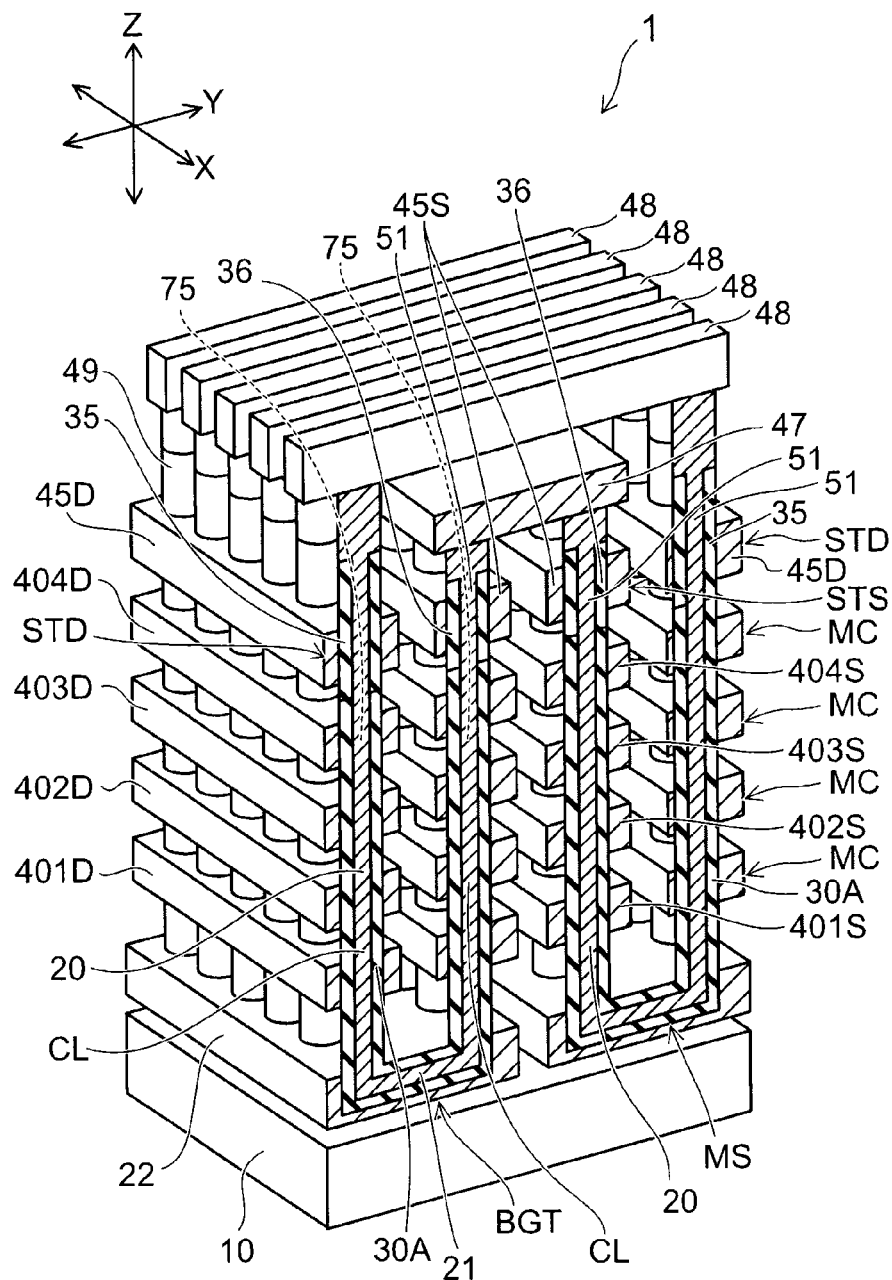
FIG. 1 is a schematic perspective view of a memory cell array portion of the nonvolatile semiconductor memory device according to a first embodiment.

FIG. 1 is a schematic perspective view of a memory cell array portion of the nonvolatile semiconductor memory device according to the first embodiment.

Figure 2:
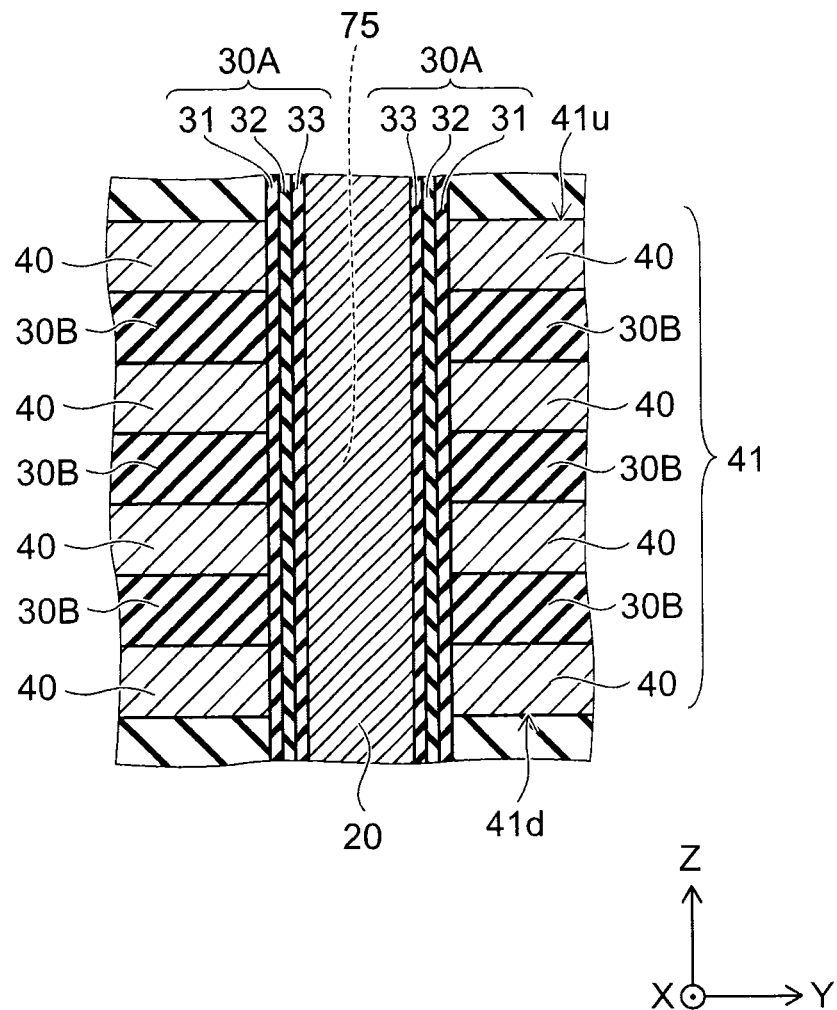
FIG. 2 is an enlarged schematic cross-sectional view of a memory cell portion according to the first embodiment.

FIG. 2 is an enlarged schematic cross-sectional view of a memory cell portion according to the first embodiment.

In FIG. 1, for ease of viewing of the figure, insulating portions other than the insulating film formed on the inner wall of a memory hole 75 are not illustrated.

In FIG. 1, for ease of description, an XYZ orthogonal coordinate system is introduced. In the coordinate system, it is assumed that two directions parallel to the major surface of a substrate 10 and perpendicular to each other are an X direction and a Y direction, and that a direction perpendicular to both the X direction and the Y direction is a Z direction.

The nonvolatile semiconductor memory device 1 includes memory strings in which the memory cells are connected in series. In the nonvolatile semiconductor memory device 1, on the substrate 10, via an unillustrated insulating layer, a semiconductor layer 22 (a back gate layer or a first semiconductor layer) is provided. The substrate 10 and the insulating layer are collectively referred to as a foundation layer. Within the substrate 10, active elements such as a transistor and passive elements such as a resistor and a capacitor are provided. The semiconductor layer 22 is a silicon (Si) layer to which an impurity element is added, for example.

On the semiconductor layer 22, a plurality of insulating layers 30B (see FIG. 2), drain-side electrode layers 401D, 402D, 403D and 404D and source-side electrode layers 401S, 402S, 403S and 404S are alternately stacked.

The electrode layer 401D and the electrode layer 401S are provided in the same level layer and indicate the first layer from the bottom. The electrode layer 402D and the electrode layer 402S are provided in the same level layer and indicate the second layer from the bottom. The electrode layer 403D and the electrode layer 403S are provided in the same level layer and indicate the third layer from the bottom. The electrode layer 404D and the electrode layer 404S are provided in the same level layer and indicate the fourth layer from the bottom.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

An unillustrated insulating layer is provided between the electrode layer 401D and the electrode layer 401S, between the electrode layer 402D and the electrode layer 402S, between the electrode layer 403D and the electrode layer 403S and between the electrode layer 404D and the electrode layer 404S.

The electrode layers 401D, 402D, 403D and 404D are provided between the semiconductor layer 22 and a drain-side selection gate electrode 45D. The electrode layers 401S, 402S, 403S and 404S are provided between the semiconductor layer 22 and a source-side selection gate electrode 45S.

Moreover, in the following description, the electrode layers 401D, 402D, 403D, 404D, 401S, 402S, 403S and 404S may be collectively and simply referred to as electrode layers 40. Furthermore, the number of electrode layers 40 is arbitrary, and is not limited to four as illustrated in the first embodiment.

The electrode layer 40 is, for example, a silicon layer to which an impurity element such as boron (B) is added so as to have conductivity. The insulating layer 30B contains, for example, silicon oxide.

The drain-side selection gate electrode 45D is provided on the electrode layer 404D, via an unillustrated insulating layer. The drain-side selection gate electrode 45D is, for example, a silicon layer to which an impurity is added so as to have conductivity.

The source-side selection gate electrode 45S is provided on the electrode layer 404S, via an unillustrated insulating layer. The source-side selection gate electrode 45S is, for example, a silicon layer to which an impurity is added so as to have conductivity.

The drain-side selection gate electrode 45D and the source-side selection gate electrode 45S are divided in the Y direction. The drain-side selection gate electrode 45D and the source-side selection gate electrode 45S may be simply referred to as a selection gate electrode 45 without being distinguished.

A source line 47 is provided on the source-side selection gate electrode 45S, via an unillustrated insulating layer. The source line 47 is connected to a channel body layer 51 connected to any one of a pair of channel body layers 20. The source line 47 is a metal layer or a silicon layer to which an impurity is added so as to have conductivity.

A plurality of bit lines 48 are provided on the drain-side selection gate electrode 45D and the source line 47, via an unillustrated insulating layer. The bit lines 48 are connected via a via 49 to the channel body layer 51 connected to the other of the pair of channel body layers 20. The bit lines 48 extend in the Y direction.

In the semiconductor layer 22 and a stacked body 41 on this semiconductor layer 22, a plurality of U-shaped memory holes 75 are formed. For example, in the electrode layers 401D to 404D and the drain-side selection gate electrode 45D, holes penetrating them and extending in the Z direction are formed. In the electrode layers 401S to 404S and the source-side selection gate electrode 45S, holes penetrating them and extending in the Z direction are formed. Those pairs of holes extending in the Z direction are connected via a concave portion (space portion) formed within the semiconductor layer 22 to constitute the U-shaped memory holes 75. In the first embodiment, not only the U-shaped memory holes but also straight type memory holes are included.

Within the memory hole 75, the U-shaped channel body layer 20 (first channel body layer) is provided. The channel body layer 20 is, for example, a silicon layer. Between the channel body layer 20 and the inner wall of the memory hole 75, a memory film 30A is provided.

Between the channel body layer 51 (second channel body layer) connected to the channel body layer 20 and the drain-side selection gate electrode 45D, a gate insulating film 35 is provided. The channel body layer 51 is, for example, a silicon layer. Between the channel body layer 51 and the source-side selection gate electrode 45S, a gate insulating film 36 is provided.

The structure is not limited to a structure where the entire memory hole 75 is filled with the channel body layers 20, and may be a structure in which the channel body layers 20 are formed to leave hollow portions on the center axis side of the memory hole 75, and an insulating material is embedded in the inside hollow portions.

The memory film 30A has, for example, an ONO (Oxide-Nitride-Oxide) structure in which a silicon nitride film is sandwiched between a pair of silicon oxide films. As shown in FIG. 2, between the electrode layer 40 and the channel body layer 20, sequentially from the side of the electrode layer 40, an insulating film 31, a charge storage film 32 and an insulating film 33 are provided. The insulating film 31 is in contact with the electrode layers 40, the insulating film 33 is in contact with the channel body layer 20 and the charge storage film 32 is provided between the insulating film 31 and the insulating film 33. Between the electrode layers 40, the insulating layer 30B is provided. The insulating film 31 is, for example, a silicon oxide film. The charge storage film 32 is, for example, a silicon nitride film. The insulating film 33 is, for example, a silicon oxide film.

The channel body layer 20 functions as a channel in the transistors constituting the memory cell, the electrode layer 40 functions as a control gate, and the charge storage film 32 functions as a data storage layer that stores charge injected from the channel body layer 20. That is, in the intersection portion of the channel body layer 20 and the electrode layer 40, a memory cell MC having a structure where the channel is surrounded by the control gate is formed.

The nonvolatile semiconductor memory device 1 of the first embodiment is a nonvolatile semiconductor memory device that can electrically freely erase and write data and hold stored information even if power is turned off.

The drain-side selection gate electrode 45D, the channel body layer 51 and the gate insulating film 35 between them constitute a drain-side selection transistor STD. The channel body layer 51 above the drain-side selection transistor STD is connected to the bit line 48.

The source-side selection gate electrode 45S, the channel body layer 51 and the gate insulating film 36 between them constitute a source-side selection transistor STS. The channel body layer 51 above the source-side selection transistor STS is connected to the source line 47.

The semiconductor layer 22, the channel body layer 20 provided within the semiconductor layer 22 and the memory film 30A constitute a semiconductor layer transistor BGT.

Between the drain-side selection transistor STD and the semiconductor layer transistor BGT, a plurality of memory cells MCs that use the electrode layers 404D to 401D as the control gate are provided. Likewise, between the semiconductor layer transistor BGT and the source-side selection transistor STS, a plurality of memory cells MCs that use the electrode layers 401S to 404S as the control gate are also provided.

The plurality of memory cells MCs, the drain-side selection transistor STD, the semiconductor layer transistor BGT and the source-side selection transistor STS are serially connected via the channel body layer, and constitute one U-shaped memory string MS.

One memory string MS includes a pair of columnar portions CLs that extend in the stacking direction of the stacked body 41 including a plurality of electrode layers 40 and a coupling portion 21 that is embedded in the semiconductor layer 22 and that couples the pair of columnar portions CL. A plurality of memory strings MSs described above are aligned in the X direction and the Y direction, and thus a plurality of memory cells are three-dimensionally provided in the X direction, the Y direction and the Z direction.

The plurality of memory strings MSs are provided in a memory cell array region on the substrate 10. For example, around the memory cell array region on the substrate 10, peripheral circuits for controlling the memory cell array are provided.

Figures 3A, 3B:
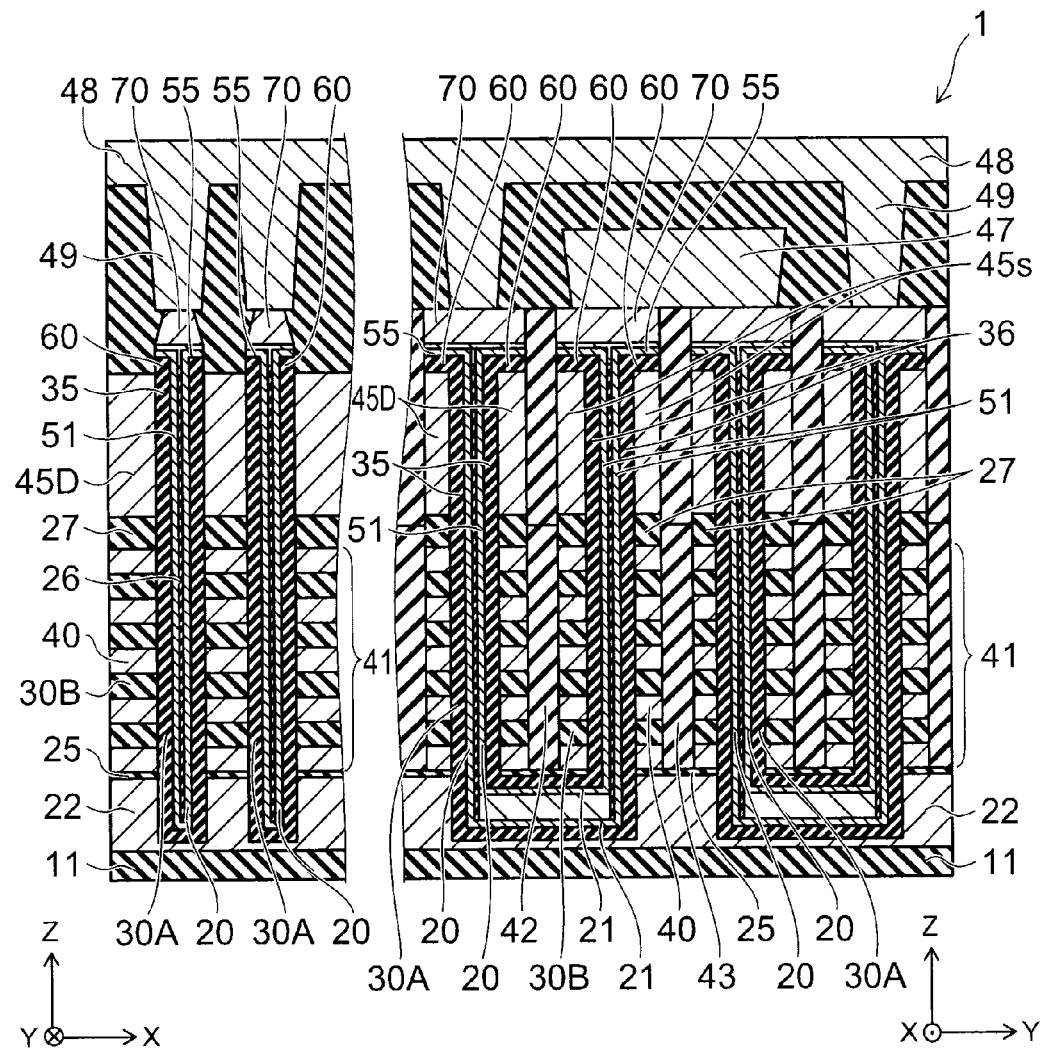
FIGS. 3A and 3B are schematic cross-sectional views of the nonvolatile semiconductor memory device according to the first embodiment.

FIGS. 3A and 3B are schematic cross-sectional views of the nonvolatile semiconductor memory device according to the first embodiment; FIG. 3A is a schematic cross-sectional view on an X-Z plane of FIG. 1; FIG. 3B is a schematic cross-sectional view on a Y-Z plane of FIG. 1.

In the nonvolatile semiconductor memory device 1 according to the first embodiment, the stacked body 41 is provided on the foundation layer 11. The stacked body 41 includes a plurality of electrode layers 40 and a plurality of insulating layers 30B (first insulating layers) alternately stacked. The semiconductor layer 22 is provided between the stacked body 41 and the foundation layer 11. An insulating layer 25 is inserted between the stacked body 41 and the semiconductor layer 22.

A pair of channel body layers 20 (first channel body layers) penetrate the stacked body 41 in the stacking direction (Z direction) of the stacked body 41. The lower ends of the pair of channel body layers 20 are connected by the coupling portion 21. The pair of channel body layers 20 and the coupling portion 21 form the U-shaped structure described above. The coupling portion 21 is located on the lower side from the upper face of the semiconductor layer 22. The memory film 30A is provided between each of the plurality of electrode layers 40 and the channel body layers 20.

An interlayer insulating film 27 is provided on the stacked body 41. The selection gate electrodes 45S and 45D are provided on the interlayer insulating film 27. The channel body layer 51 (the second channel body layer) penetrates the selection gate electrodes 45S and 45D and the interlayer insulating film 27 in the Z direction. The channel body layer 51 is connected to the channel body layers 20. On the source side, the gate insulating film 36 is provided between the selection gate electrode 45S and the channel body layer 51. On the drain side, the gate insulating film 35 is provided between the selection gate electrode 45D and the channel body layer 51.

An insulating layer 60 (the second insulating layer) is provided on the gate insulating films 35 and 36 and on the selection gate electrodes 45D and 45S. A contact layer 70 (cap layer) is provided on the insulating layer 60. A diffusion layer 55 is provided between the contact layer 70 and the insulating layer 60. The diffusion layer 55 is connected to the channel body layer 51 and the contact layer 70. An insulating layer 42 is provided between the U-shaped memory holes. An insulating layer 43 is provided between the adjacent U-shaped memory holes.

Figure 4A:
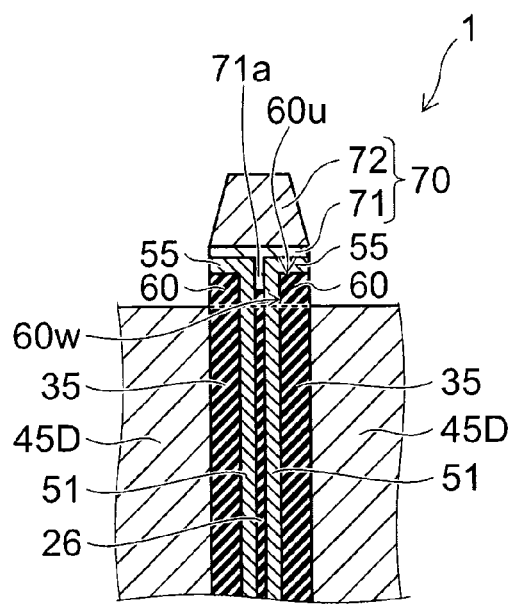
FIGS. 4A and 4B are schematic cross-sectional views of a vicinity of the gate electrode in the nonvolatile semiconductor memory device according to the first embodiment.
Figure 4B:
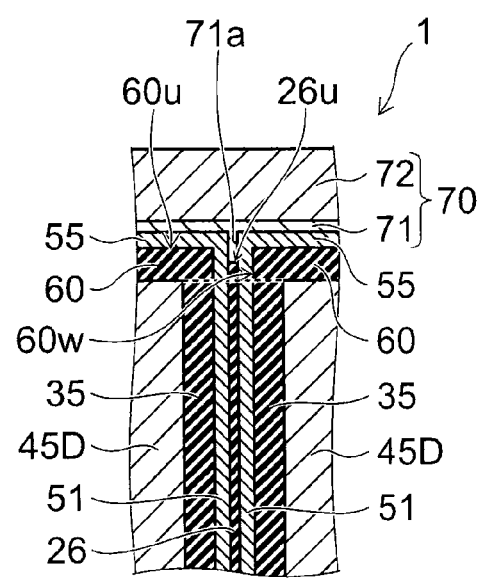

FIGS. 4A and 4B are schematic cross-sectional views of a vicinity of the gate electrode in the nonvolatile semiconductor memory device according to the first embodiment; FIG. 4A is a schematic cross-sectional view on the X-Z plane of FIG. 1; FIG. 4B is a schematic cross-sectional view on the Y-Z plane of FIG. 1.

The diffusion layer 55 described above is in contact with the inner face 60w of the insulating layer 60 and the upper end 60u of the insulating layer 60. The contact layer 70 includes a semiconductor layer 71 (first semiconductor layer) and a semiconductor layer 72 (second semiconductor layer) provided on the semiconductor layer 71. The material of the contact layer 70 contains a polysilicon. The concentration of an impurity added to the semiconductor layer 72 is higher than that of an impurity added to the semiconductor layer 71.

Moreover, the nonvolatile semiconductor memory device 1 includes an insulating layer 26 (third insulating layer) surrounded by the channel body layer 51. The insulating layer 26 is a core material. The contact layer 70 is provided on the insulating layer 26. The upper end 26u of the insulating layer 26 is lower than the upper end 60u of the insulating layer 60. A part 71a of the semiconductor layer 71 is surrounded by the diffusion layer 55.

The manufacturing process of the nonvolatile semiconductor memory device 1 will be described.

FIGS. 5A to 5D and FIGS. 6A and 6B are schematic cross-sectional views showing the manufacturing process of the nonvolatile semiconductor memory device according to the first embodiment. In FIGS. 5A to 5D and FIGS. 6A and 6B, part of the stacked body 41 and the upper side of the part are shown.

Figure 5A:
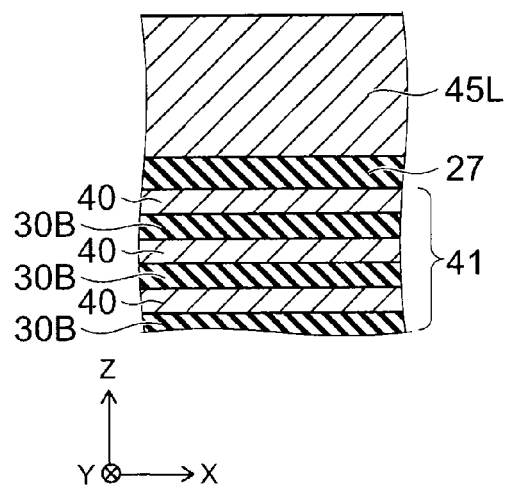
FIGS. 5A to 5D are schematic cross-sectional views showing the manufacturing process of the nonvolatile semiconductor memory device according to the first embodiment.

The stacked body 41 is first formed on the foundation layer 11 (see FIGS. 3A and 3B), and thereafter as shown in FIG. 5A, the interlayer insulating film 27 is formed on the stacked body 41. Then, a selection gate electrode layer 45L is formed on the interlayer insulating film 27.

Figure 5C:
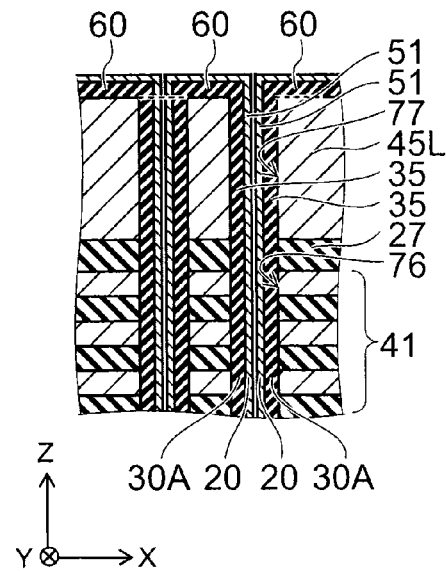
Figure 5B:
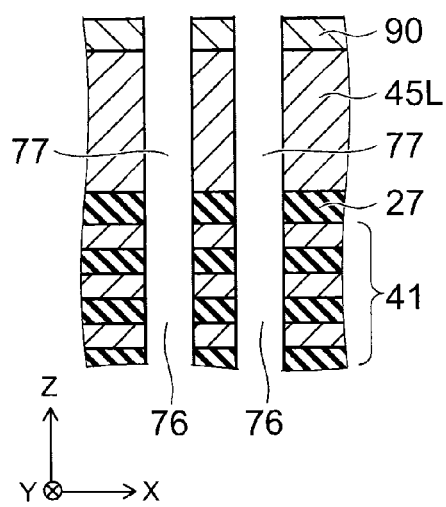

Then, as shown in FIG. 5B, a mask 90 is formed on the selection gate electrode layer 45L. Then, a pair of holes 76 (first holes) and a pair of holes 77 (second holes) are formed by RIE (Reactive Ion Etching). The pair of holes 76 penetrates the stacked body 41 in the stacking direction (Z direction) of the stacked body 41. The pair of holes 77 penetrates the selection gate electrode layer 45L and the interlayer insulating film 27 in the stacking direction. The holes 77 communicate with each of the pair of holes 76.

Then, as shown in FIG. 5C, the memory film 30A is formed on the side wall of each of the pair of holes 76. Furthermore, the gate insulating film 35 is formed on the side wall of the holes 77. The gate insulting film may be the gate insulating film 36. In the manufacturing process, the gate insulating film 35 is illustrated. Furthermore, the insulating layer 60 is formed on the gate insulating film 35 and on the selection gate electrode layer 45L. Since the memory film 30A, the gate insulating films 35 and 36 and the insulating layer 60 are formed at a time, each of them has, for example, an ONO structure.

Next, the channel body layer 20 is formed on the inner side of the memory film 30A. Furthermore, the channel body layer 51 is formed on the inner side of the gate insulating film 35 and on the insulating layer 60. The channel body layer 51 is connected to the channel body layer 20.

Figure 5D:
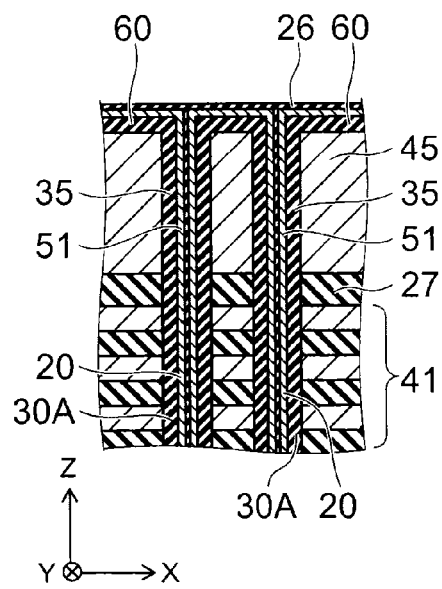

Then, as shown in FIG. 5D, the insulating layer 26 is formed on the inner side of the channel body layer 20, on the inner side of the channel body layer 51 and on the channel body layer 51.

Figure 6A:
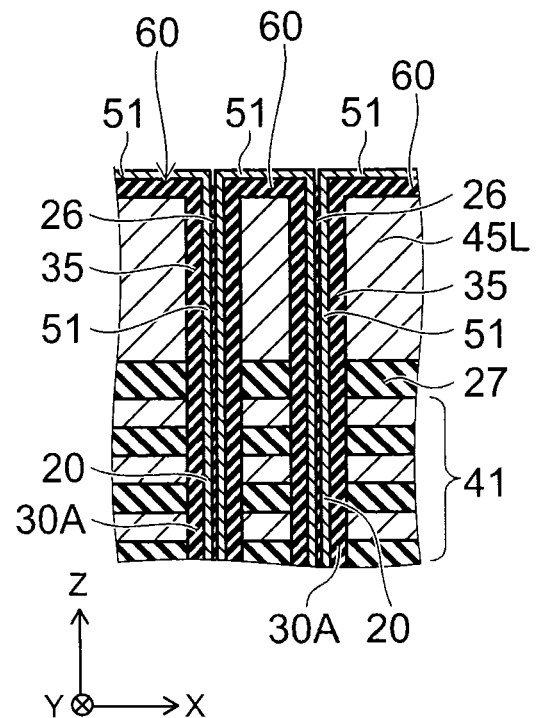
FIGS. 6A and 6B are schematic cross-sectional views showing the manufacturing process of the nonvolatile semiconductor memory device according to the first embodiment.

Then, as shown in FIG. 6A, the surface of the insulating layer 26 is etched back such that the upper end of the insulating layer 26 is lower than the upper end 60u of the insulating layer 60.

Figure 6B:
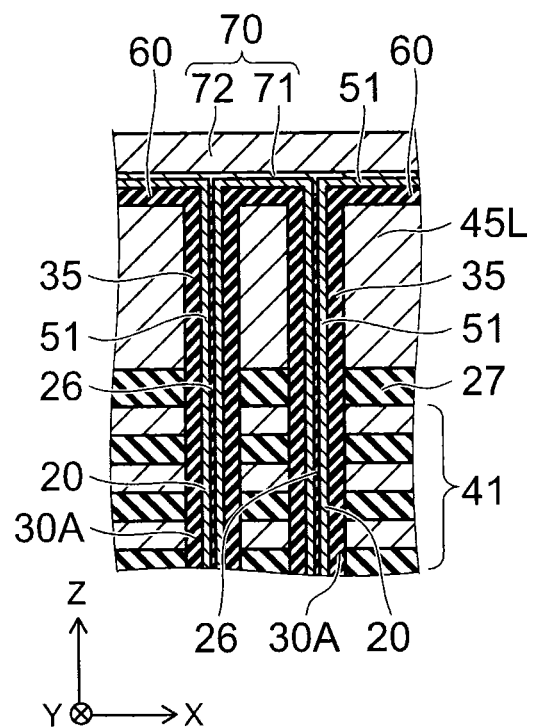

Then, as shown in FIG. 6B, the contact layer 70 is formed on the channel body layer 51 and on the insulating layer 26. The contact layer 70 in this stage is in a state where it has not been subjected to heating processing. The contact layer 70 includes the semiconductor layer 71 to which the impurity element is not added and the semiconductor layer 72 to which the impurity element is added. The semiconductor layer 71 is first formed as the initial layer, and thereafter the semiconductor layer 72 is formed on the semiconductor layer 71. A part 71a of the semiconductor layer 71 is formed on the upper end of the insulating layer 26.

Figure 7A:
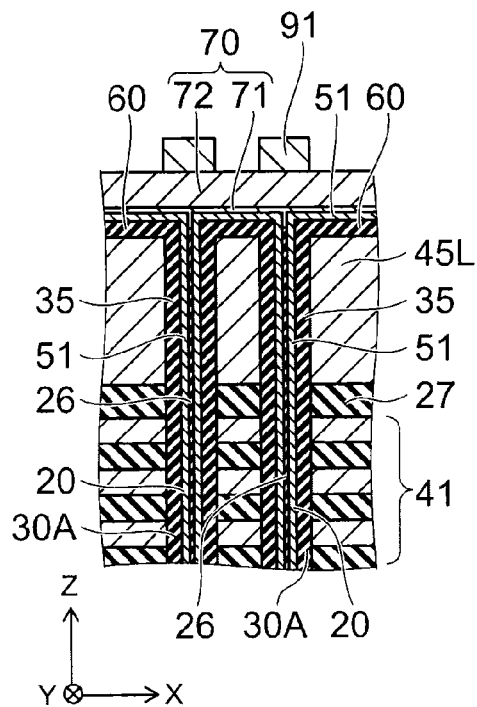
FIGS. 7A and 7B are schematic cross-sectional views showing the manufacturing process of the nonvolatile semiconductor memory device according to the first embodiment.
Figure 7C:
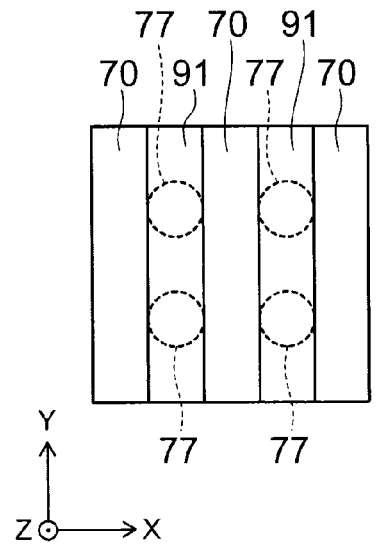
FIGS. 7C and 7D are schematic upper face views showing the manufacturing process of the nonvolatile semiconductor memory device according to the first embodiment.
Figure 7B:
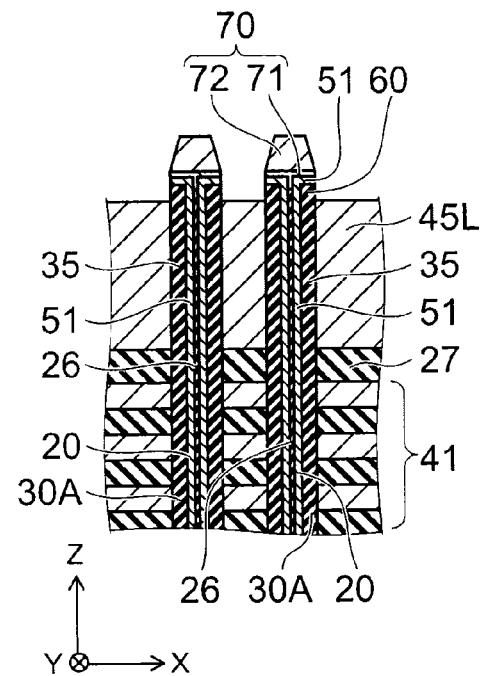
Figure 7D:
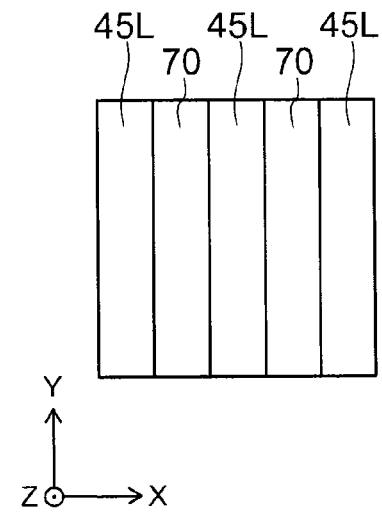

FIGS. 7A and 7B are schematic cross-sectional views showing the manufacturing process of the nonvolatile semiconductor memory device according to the first embodiment. FIGS. 7C and 7D are schematic upper face views showing the manufacturing process of the nonvolatile semiconductor memory device according to the first embodiment.

Figure 8A:
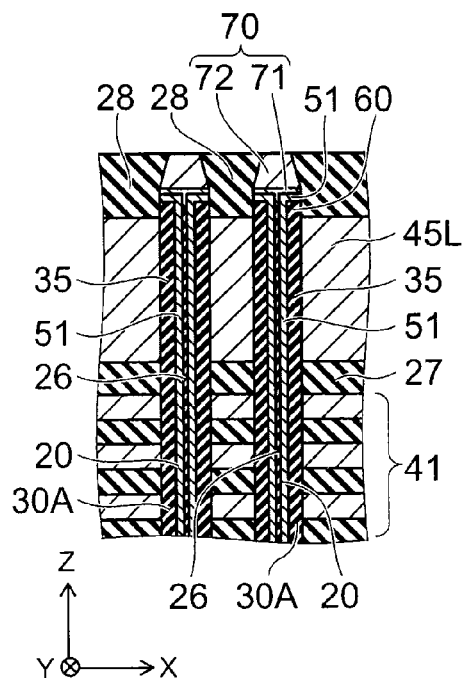
FIGS. 8A and 8C are schematic cross-sectional views showing the manufacturing process of the nonvolatile semiconductor memory device according to the first embodiment.
Figure 8C:
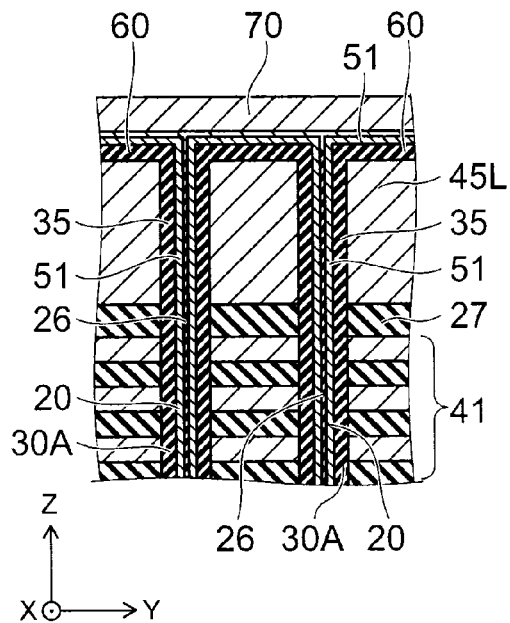
Figure 8B:
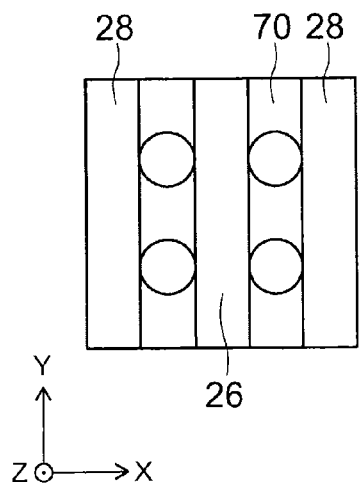
FIG. 8B is a schematic upper face view showing the manufacturing process of the nonvolatile semiconductor memory device according to the first embodiment.

FIGS. 8A and 8C are schematic cross-sectional views showing the manufacturing process of the nonvolatile semiconductor memory device according to the first embodiment. FIG. 8B is a schematic upper face view showing the manufacturing process of the nonvolatile semiconductor memory device according to the first embodiment.

Figure 9A:
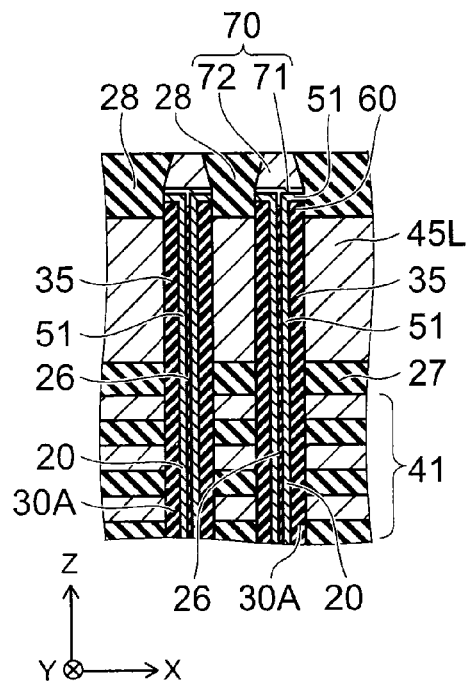
FIGS. 9A and 9C are schematic cross-sectional views showing the manufacturing process of the nonvolatile semiconductor memory device according to the first embodiment.
Figure 9C:
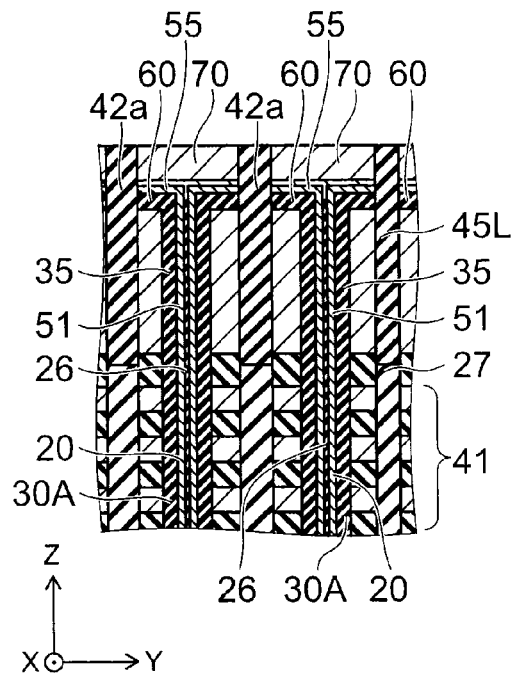
Figure 9B:
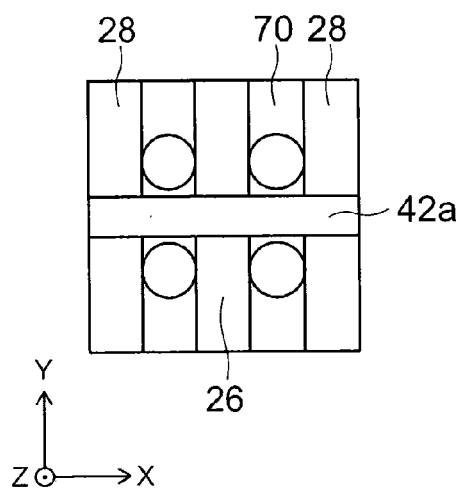
FIG. 9B is a schematic upper face view showing the manufacturing process of the nonvolatile semiconductor memory device according to the first embodiment.

FIGS. 9A and 9C are schematic cross-sectional views showing the manufacturing process of the nonvolatile semiconductor memory device according to the first embodiment. FIG. 9B is a schematic upper face view showing the manufacturing process of the nonvolatile semiconductor memory device according to the first embodiment.

Then, as shown in FIG. 7A, a mask 91 is formed on the contact layer 70. The mask 91 is located on each of the pair of holes 76, and extends in the Y direction, in which the pair of holes 76 is aligned. The mask 91 is formed by photolithography and etching.

Then, as shown in FIG. 7B, the contact layer 70 exposed from the mask 91, the channel body layer 51 below the contact layer 70 exposed from the mask 91 and the insulating layer 60 are removed by etching. Furthermore, the mask 91 is removed.

Then, as shown in FIGS. 8A to 8C, an interlayer insulating film 28 is formed between each of the plurality of contact layers 70 extending in the Y direction.

Then, as shown in FIGS. 9A to 9C, in a position between the pair of holes 76, an insulating layer 42a (fourth insulating layer) that divides the contact layer 70 and the gate electrode layer 45L continuously aligned in the Y direction is formed. The gate electrode 45 is formed by this division. The division of the contact layer 70 and the division of the selection gate electrode layer 45L are performed at a time.

Then, by heating the contact layer 70, the impurity element added to the semiconductor layer 72 is diffused through the semiconductor layer 71 to the channel body layer 51. In the diffusion of the impurity, the semiconductor layer in the shape of a thin film is interposed between the semiconductor layer 72 and the channel body layer 51, and thus an excessive amount of diffusion of the impurity to the channel body layer 51 is suppressed.

In this way, the channel body layer 51 above the selection gate electrode 45 comes to become the diffusion layer 55. The diffusion layer 55 contains a predetermined concentration of the impurity element. Since the contact layer 70 is divided in the X direction and the Y direction (cross point processing), its planar shape is rectangular. Thereafter, as shown in FIGS. 3A and 3B, the source line 47 or the bit line 48 connected to the contact layer 70 is formed.

Although in the first embodiment, an excessive amount of diffusion of the impurity to the channel body layer 51 is suppressed by the semiconductor layer 71 in the shape of a thin film, there is a method of suppressing an excessive amount of diffusion of the impurity to the channel body layer 51 by a bulk semiconductor layer (hereinafter, a reference example).

Figure 10:
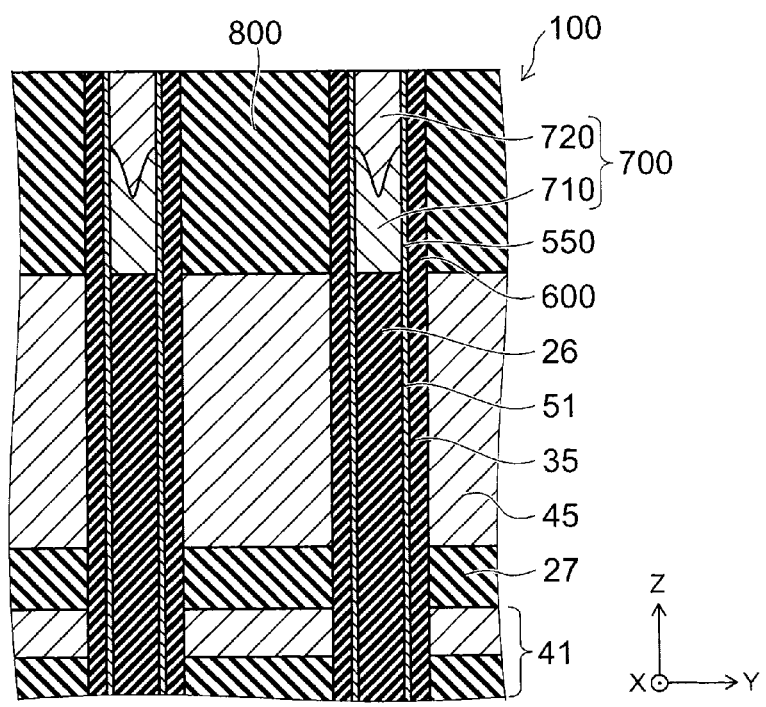
FIG. 10 is a schematic cross-sectional view of a nonvolatile semiconductor memory device according to the reference example.

FIG. 10 is a schematic cross-sectional view of a nonvolatile semiconductor memory device according to the reference example.

In a nonvolatile semiconductor memory device 100 according to the reference example, an insulating layer 600 is provided on the gate insulating film 35. Moreover, the upper end of the insulating layer 26, which is the core material, is substantially equal in height to that of the gate electrode 45. A contact layer 700 is provided on the insulating layer 26. The contact layer 700 includes a semiconductor layer 710 to which an impurity element has not been added before heating and a semiconductor layer 720 to which an impurity element has been added before heating. The material of the contact layer 700 contains a polysilicon. Between the semiconductor layer 710 and the insulating layer 600, a diffusion layer 550 is provided. Moreover, on the outside of the insulating layer 600, an interlayer insulating film 800 is provided.

Also in the reference example, by heating the contact layer 700, it is also possible to diffuse the impurity element added to the semiconductor layer 720 to the channel body layer 51. Further, the semiconductor layer 710 in bulk is interposed between the semiconductor layer 720 and the insulating layer 26, and thus an excessive amount of diffusion of the impurity to the channel body layer 51 is suppressed. As a result, the diffusion layer 550 containing a predetermined concentration of the impurity element is formed between the semiconductor layer 710 and the insulating layer 600.

However, it is difficult to uniformly control the shape of each of a plurality of semiconductor layers 710. This reason will be described below.

Figure 11:
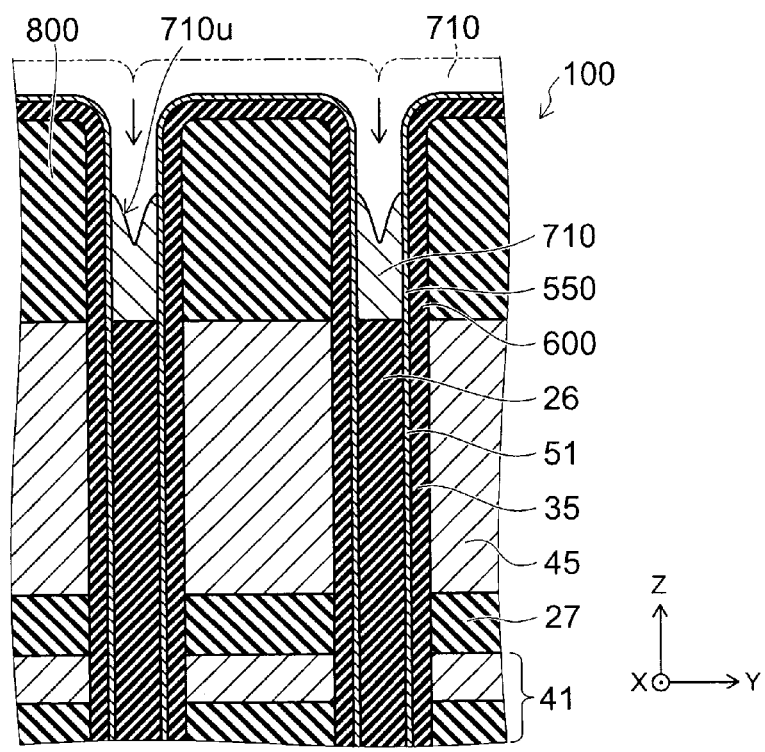
FIG. 11 is a schematic cross-sectional view showing the manufacturing process of the nonvolatile semiconductor memory device according to the reference example.

FIG. 11 is a schematic cross-sectional view showing the manufacturing process of the nonvolatile semiconductor memory device according to the reference example.

With respect to the semiconductor layer 710 described above, the semiconductor layer 710 is previously deposited as a film both within the holes on the insulating layer 26 and on the interlayer insulating film 800, and thereafter is formed by etching back. That is, the surface of the semiconductor layer 710 in the shape of a layer is moved down in a direction indicated by arrows, and thus the semiconductor layer 710 is formed.

However, after the etching back, the shape of each of a plurality of semiconductor layers 710 is not necessarily formed uniformly. This is because the shape of each of the plurality of semiconductor layers 710 is affected by variations within face in the etching rate, variations in the hole diameter, or variations in how much the semiconductor layer 710 is embedded in the hole.

Variations in the shape of the semiconductor layer 710 as described above cause variations in the distance (the distance in the Z direction) between the upper end 710u of the semiconductor layer 710 and the upper end of a channel region. Here, the channel region is assumed to be a region where the channel body layer 51 is in contact with the gate electrode 45 via the gate insulating film. When the heating processing is performed in this state, this causes variations in the length (the length in the Z direction) of each of a plurality of diffusion layers 550.

Here, the distance (the distance in the Z direction) over which the selection gate electrode and the diffusion layer face each other via the gate insulating film is assumed to be the length over which the diffusion layer intrudes into the channel region. Variations in the length of each of the plurality of diffusion layers 550 cause variations in the length over which the diffusion layer 550 intrudes into the channel region. As a result, the threshold value (Vth) of the transistor, that needs to be controlled by the gate electrode 45, will vary.

In contrast, the contact layer 70 according to the first embodiment includes the semiconductor layer 71 in the shape of a thin film and the semiconductor layer 72 provided on the semiconductor layer 71. Before the heating processing, the semiconductor layer 71 includes an additive-free polysilicon layer, and the semiconductor layer 72 includes an impurity element-doped polysilicon layer.

In the first embodiment, each of a plurality of semiconductor layers 71 does not need to be formed by etching processing. The thickness of each of the plurality of semiconductor layers 71 is determined by the thickness of the semiconductor layer 71 at the time of deposition. Hence, the distance (the distance in the Z direction) between the upper face of the semiconductor layer 71 and the upper end of the channel region is hard to vary as compared with the reference example. Thus, the length over which the diffusion layer 55 intrudes into the channel region is hard to vary. Consequently, the threshold (Vth) of the transistors STD and STS, which needs to be controlled by the gate electrode 45, is hard to vary.

Moreover, in the nonvolatile semiconductor memory device, there is a case where a GIDL (Gate Induced Drain Leakage) current is actively utilized. When variations in the length over which the diffusion layer intrudes into the channel region cause the selection gate electrode and the diffusion layer to be excessively overlapped, the thickness of the film of the selection gate electrode needs to be increased so that an inversion layer is acquired. In the first embodiment, it is possible to avoid this.

(Modification of the First Embodiment)

In the first embodiment, as the mask 91 for processing the contact layer 70, the line pattern is illustrated. In this modification, as the mask for processing the contact layer 70, an island-shaped pattern is illustrated.

Figure 12A:
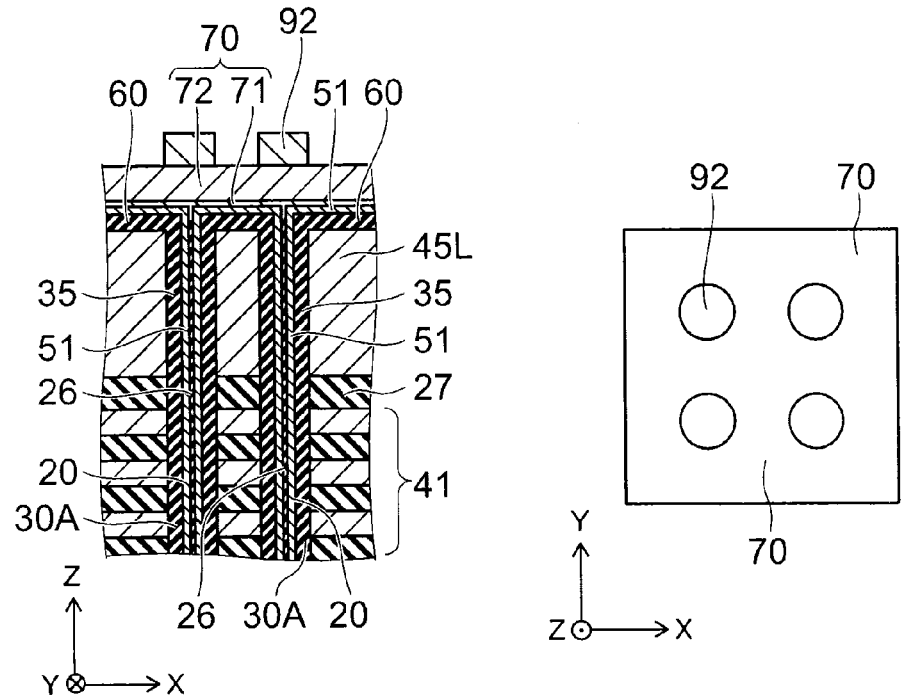
FIGS. 12A and 12B each including a schematic cross-sectional view and a schematic upper face view and showing the manufacturing process of a nonvolatile semiconductor memory device according to the modification of the first embodiment.
Figure 12B:
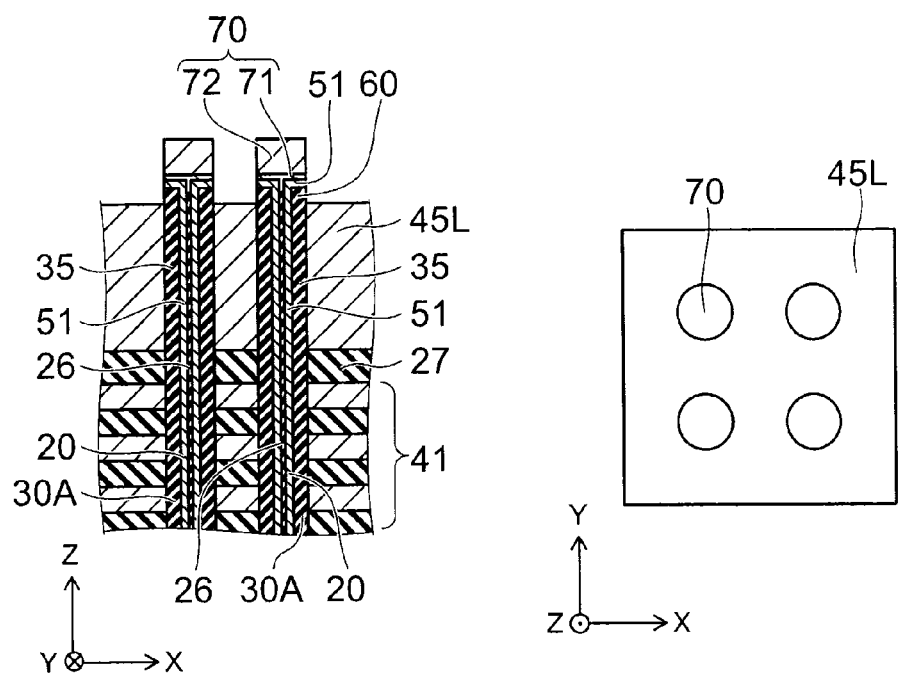

FIGS. 12A and 12B each including a schematic cross-sectional view and a schematic upper face view and showing the manufacturing process of a nonvolatile semiconductor memory device according to the modification of the first embodiment.

First, as shown in FIG. 12A, a mask 92 is formed on the contact layer 70. The mask 92 is, for example, a mask whose planar shape is circular, and is located on each of the pair of holes 76. The mask 92 is formed by photolithography and etching.

Then, as shown in FIG. 12B, the contact layer 70 exposed from the mask 92, the channel body layer 51 below the contact layer 70 exposed from the mask and the insulating layer 60 are removed. Thereafter, in the position between the pair of holes 76, the insulating layer 42a (see FIGS. 9A to 9C) that divides the contact layer 70 and the gate electrode layer 45L continuously aligned in the Y direction is formed.

In the manufacturing process as described above, the number of times the contact layer 70 is subjected to the etching processing is one. Thus, it is possible to reduce a time needed for the manufacturing process and the cost.

(Second Embodiment)

Figures 13A, 13B:
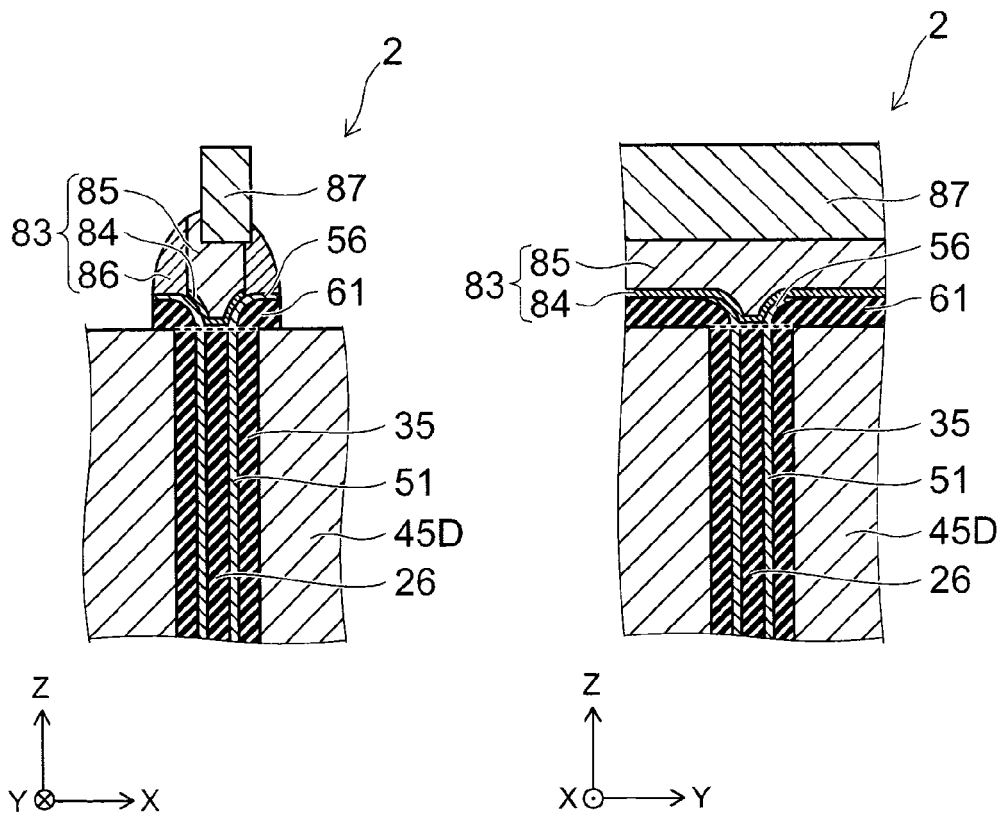
FIGS. 13A and 13B are schematic cross-sectional views of a vicinity of the gate electrode of a nonvolatile semiconductor memory device according to a second embodiment.

FIGS. 13A and 13B are schematic cross-sectional views of a vicinity of the gate electrode of a nonvolatile semiconductor memory device according to a second embodiment; FIG. 13A is a schematic cross-sectional view in the X-Z plane on FIG. 1; FIG. 13B is a schematic cross-sectional view on the Y-Z plane of FIG. 1.

In a nonvolatile semiconductor memory device 2 according to the second embodiment, a contact layer 83 includes a semiconductor layer 84 (third semiconductor layer) provided on the insulating layer 26, a semiconductor layer 85 (fourth semiconductor layer) provided on the semiconductor layer 84 and a conductor layer 86 in contact with a side wall of the semiconductor layer 85. An insulating layer 61 is in contact with the upper end of the gate electrode 45D. On the insulating layer 61, the conductor layer 86 is provided. A diffusion layer 56 is connected to the channel body layer 51. The diffusion layer 56 is inserted between the insulating layer 61 and the contact layer 83.

The material of the semiconductor layers 84 and 85 contains a polysilicon. The concentration of an impurity element added to the semiconductor layer 85 is higher than that of an impurity element added to the semiconductor layer 84.

The manufacturing process of the nonvolatile semiconductor memory device 2 will be described. The manufacturing process illustrated in FIGS. 5A to 6B is applied to the second embodiment. The subsequent manufacturing process from the state of FIG. 6B will be described.

FIGS. 14A to 14D are schematic cross-sectional views showing the manufacturing process of the nonvolatile semiconductor memory device according to the second embodiment.

Figure 15A:
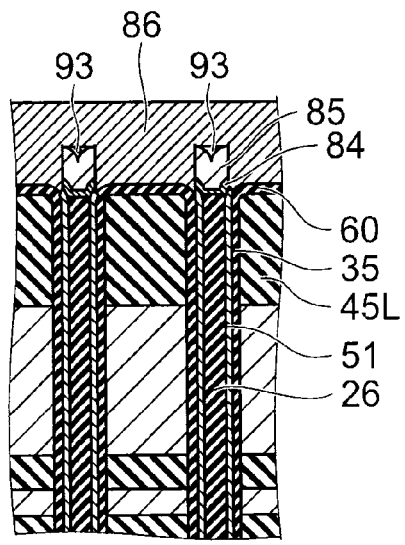
FIGS. 15A to 15C are schematic cross-sectional views showing the manufacturing process of the nonvolatile semiconductor memory device according to the second embodiment.
Figure 15C:
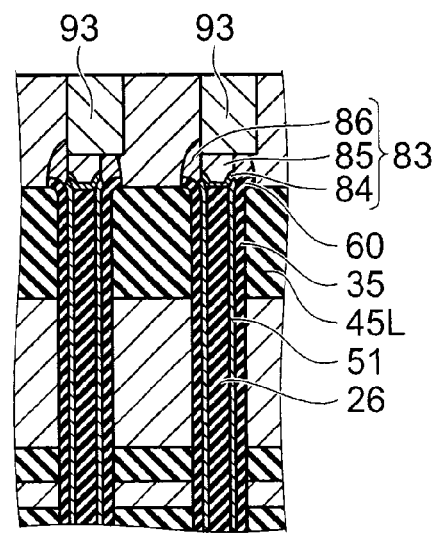
Figure 15B:
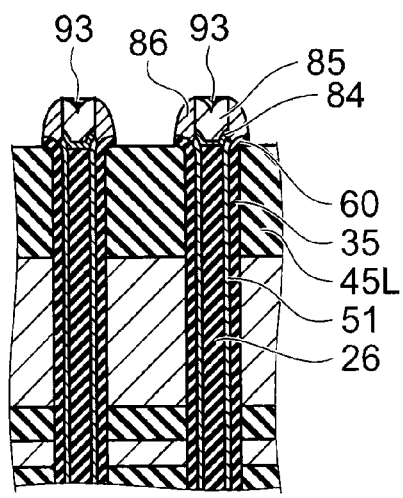

FIGS. 15A to 15C are schematic cross-sectional views showing the manufacturing process of the nonvolatile semiconductor memory device according to the second embodiment.

Figure 14A:
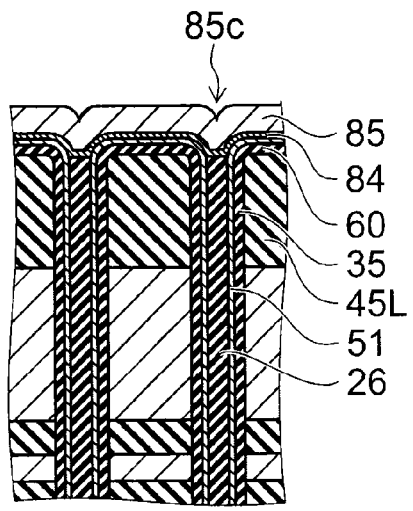
FIGS. 14A to 14D are schematic cross-sectional views showing the manufacturing process of the nonvolatile semiconductor memory device according to the second embodiment.

As shown in FIG. 14A, on the channel body layer 51 and on the insulating layer 26, the semiconductor layer 84 and the semiconductor layer 85, which are part of the contact layer, are deposited. In this stage, the semiconductor layer 84 contains an additive-free polysilicon, and the semiconductor layer 85 contains an impurity element-doped polysilicon. The upper end of the insulating layer 26 is located below the upper end of the insulating layer 61. Hence, in the semiconductor layer 85, a concave portion 85c is formed in a position above the insulating layer 26.

Figure 14B:
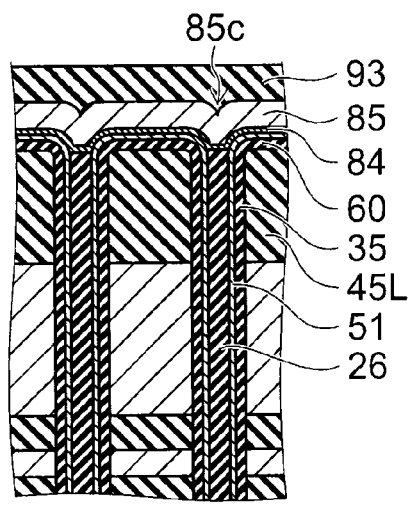

Then, as shown in FIG. 14B, on the semiconductor layer 85, an insulating layer 93 (fifth insulating layer) is formed.

Figure 14C:
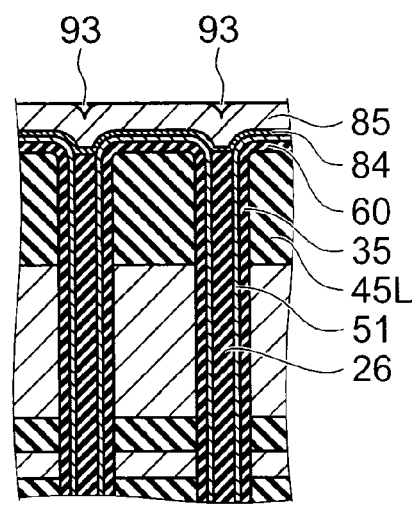

Then, as shown in FIG. 14C, the insulating layer 93 is removed from above the semiconductor layer 85 so that the insulating layer 93 within the concave portion 85c remains. For example, the surface side of the insulating layer 93 is subjected to CMP (Chemical Mechanical Polishing) polishing. When the parts of the semiconductor layer 85 other than the concave portion 85c are exposed from the insulating layer 93, the CMP polishing is stopped.

Figure 14D:
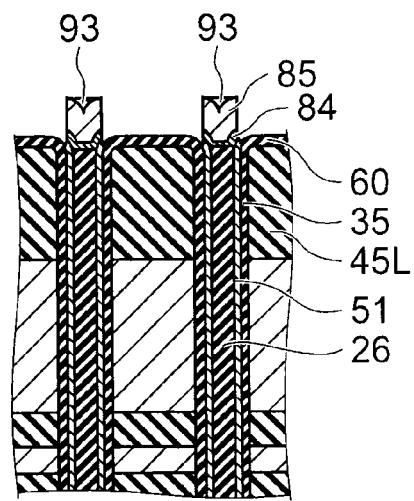

Then, as shown in FIG. 14D, with the insulating layer 93 remaining within the concave portion 85c being used as a mask, the semiconductor layers 84 and 85 exposed from this mask and the channel body layer 51 below the semiconductor layers 84 and 85 exposed from the mask are etched.

Then, as shown in FIG. 15A, the mask (the insulating layer 93) and the conductor layer 86 covering the semiconductor layers 84 and 85 below the mask are formed on the insulating layer 61.

Then, as shown in FIG. 15B, the surface of the conductor layer 86 is etched back. In the etching back, by the shielding effect of the semiconductor layer 85 below the insulating layer 93, the conductor layer 86 in contact with the side wall of the semiconductor layer 85 remains. Then, with the conductor layer 86 in contact with the mask (the insulating layer 93) and the side wall of the semiconductor layer 85 being used as another mask, the insulating layer 61 exposed from this mask is etched. In other words, the conductor layer 86 is a reinforcing portion that compensates for the width in the X direction of the insulating layer 93 and the semiconductor layer 85 below the insulating layer 93.

Then, as shown in FIG. 15C, the insulating layer 93 is removed, and a contact layer 87 connected to the semiconductor layer 85 and the conductor layer 86 is formed.

Then, by heating the contact layer 83, the impurity element added to the semiconductor layer 85 is diffused through the semiconductor layer 84 to the channel body layer 51. In the impurity diffusion, the semiconductor layer 84 in the shape of a thin film is interposed between the semiconductor layer 85 and the channel body layer 51, and thus an excessive amount of diffusion of the impurity to the channel body layer 51 is suppressed. Thus, the channel body layer 51 above the selection gate electrode 45D comes to become the diffusion layer 56. The diffusion layer 56 contains a predetermined concentration of the impurity element. Thereafter, as shown in FIGS. 3A and 3B, the source line 47 or the bit line 48 connected to the contact layer 87 is formed.

In the second embodiment, each of a plurality of semiconductor layers 84 does not need to be formed by etching processing. The thickness of each of the plurality of semiconductor layers 84 is determined by the thickness of the semiconductor layer 84 at the time of deposition. Hence, in the second embodiment, the same effect as in the first embodiment is also obtained.

Moreover, in the second embodiment, the insulating layer 93 remaining within the concave portion 85c on the insulating layer 26 is utilized as a mask for etching. This mask is formed by self-alignment. If this mask is formed by photolithography, a deviation in alignment at the time of photolithography is generated. The "deviation" becomes more remarkable as the integration density of the elements is increased. In the second embodiment, since the mask is formed by self-alignment, "deviation" is hard to be generated.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a foundation layer;
   a stacked body provided on the foundation layer, and the stacked body including a plurality of electrode layers and a plurality of first insulating layers alternately stacked;
   a first semiconductor member extending in the stacked body in a stacking direction of the stacked body;
   a memory film provided between each of the plurality of electrode layers and the first semiconductor member;
   an interlayer insulating film provided above the stacked body;
   a selection gate electrode provided on the interlayer insulating film;
   a second semiconductor member extending in the selection gate electrode and the interlayer insulating film in the stacking direction, and the second semiconductor member being connected to the first semiconductor member;

a gate insulating film provided between the selection gate electrode and the second semiconductor member;

a second insulating layer provided on the gate insulating film and on the selection gate electrode;

a contact layer provided above an upper face of the second insulating layer; and a diffusion layer provided between the contact layer and the upper face of the second insulating layer, and the diffusion layer being connected to the second semiconductor member and the contact layer.

2. The device according to claim 1, wherein the diffusion layer is in contact with an inner side face of the second insulating layer and the upper face of the second insulating layer.

3. The device according to claim 1, wherein the contact layer includes a first semiconductor layer and a second semiconductor layer provided on the first semiconductor layer, and a concentration of an impurity element added to the second semiconductor layer is higher than a concentration of an impurity element added to the first semiconductor layer.

4. The device according to claim 1, further comprising:

a third insulating layer surrounded by the second semiconductor member, wherein the contact layer is provided on the third insulating layer.

5. The device according to claim 4, wherein the contact layer includes a first semiconductor layer and a second semiconductor layer provided on the first semiconductor layer, an impurity element is not added in the first semiconductor layer, and an impurity element is added in the second semiconductor layer, an upper end of the third insulating layer is lower than the upper face of the second insulating layer, and a part of the first semiconductor layer is surrounded by the diffusion layer.

6. The device according to claim 4, wherein the contact layer includes a third semiconductor layer provided on the third insulating layer, a fourth semiconductor layer provided on the third semiconductor layer and a conductor layer in contact with a side wall of the fourth semiconductor layer.

7. The device according to claim 6, wherein the second insulating layer is in contact with an upper end of the gate electrode, and the conductor layer is provided on the second insulating layer in contact with the upper end of the gate electrode.

* * * * *